United States Patent [19]

Glazebrook

[11] Patent Number: 5,418,503
[45] Date of Patent: May 23, 1995

[54] COMPENSATION OF TRANSIENT FREQUENCY DRIFT IN OSCILLATOR CIRCUITS

[75] Inventor: Ellis Glazebrook, Lynchburg, Va.

[73] Assignee: Ericsson GE Mobile Communications Inc., Lynchburg, Va.

[21] Appl. No.: 27,771

[22] Filed: Mar. 8, 1993

[51] Int. Cl.$^6$ ............................................. H03L 3/00
[52] U.S. Cl. ............................. 331/167; 331/177 V; 331/175
[58] Field of Search ............... 331/175, 177 V, 117 R, 331/117 FE, 167

[56] References Cited

U.S. PATENT DOCUMENTS

| | | | |
|---|---|---|---|
| 3,619,803 | 11/1971 | Klein | 331/8 |
| 3,993,958 | 11/1976 | Gutsogeorge | 328/109 |
| 4,521,918 | 6/1985 | Challen | 455/343 |
| 4,533,881 | 8/1985 | Monett | 331/167 |
| 4,546,329 | 10/1985 | Unger | 331/16 |
| 4,602,222 | 7/1986 | Wynn | 331/179 |
| 4,633,197 | 12/1986 | Vanderpool, II | 332/16 T |
| 4,736,169 | 4/1988 | Weaver et al. | 331/117 R |
| 4,748,425 | 5/1988 | Heck | 332/19 |
| 4,810,974 | 3/1989 | Hulbert et al. | 331/1 A |
| 4,835,492 | 5/1989 | Ikuhara et al. | 331/175 |
| 4,926,144 | 5/1990 | Bell | 332/124 |
| 4,970,472 | 11/1990 | Kennedy et al. | 331/8 |
| 4,978,930 | 12/1990 | Suter | 331/176 |
| 5,036,295 | 7/1991 | Kamitami | 331/10 |

*Primary Examiner*—Andrew M. Dolinar
*Attorney, Agent, or Firm*—Nixon & Vanderhye

[57] ABSTRACT

A compensation circuit including resistors, capacitors and a varactor diode powered simultaneously by the same voltage source applied to a voltage controlled oscillator for reducing deviation from a desired oscillator output frequency on power-up. When power is applied, an exponentially varying voltage is applied to the varactor diode changing its capacitance in such a manner as to change the oscillator frequency in the opposite direction to its natural drift tendency, thus producing a substantially constant output frequency over the period of interest.

13 Claims, 1 Drawing Sheet

5,418,503

COMPENSATION OF TRANSIENT FREQUENCY DRIFT IN OSCILLATOR CIRCUITS

FIELD OF THE INVENTION

The invention relates generally to voltage controlled oscillator circuits and more particularly to the application of a compensating voltage to the tank circuit of a voltage controlled oscillator on power-up so as to force the oscillator to reach its stable output frequency in the shortest time possible.

BACKGROUND OF THE INVENTION

In portable battery operated radio transceivers it is always desirable to use the available battery power efficiently in order to prolong the use of the battery and thus reduce the significant expense and frequency of battery replacement or recharging. It is also clearly desirable to minimize circuit complexity as well as maintenance requirements while simultaneously consistently obtaining good performance with a reduction in cost and size.

As to the inclusion of power conservation features, such considerations are particularly important in transceivers employing a frequency synthesizer since such circuits are typically responsible for a significant portion of the overall power consumption. For example, in systems without power conservation features, the receiver section of the transceiver is conventionally operated in a "standby" mode when no received signal of significant strength is present. The transmitter section would also operate in the "standby" mode in the absence of the toggling of a push-to-talk switch. However, since transceiver components may remain active for substantial periods of time in the relatively high power consumption standby mode while awaiting the occurrence of incoming signals or activation of the transmitter, such standby modes can nevertheless result in significant waste of battery power.

For these reasons various attempts in the prior art have been made so as to provide for conservation of power in the standby mode. For example, one solution known in the prior art is to repeatedly turn the entire receiver section on and off while operating in the standby mode in such a manner that the "on" time or duty cycle is substantially shorter in duration than the "off" intervals. Examples of such systems are found in U.S. Pat. Nos. 4,419,765 to Wycoff et al, 4,531,237 to Bar-on et al and U.S. Pat. No. 4,736,461 to Kawasaki et al.

Another example may be found in U.S. Pat. No. 4,521,918 issued to Challen on Jun. 4, 1985 which discloses a battery saving frequency synthesizer arrangement wherein power to the phase-lock loop section of the synthesizer is periodically turned off. However, a control signal is provided during the power interruption for the purpose of maintaining the voltage controlled oscillator (VCO) frequency in order to prevent frequency drift. This feature allows the phase-lock loop to lock into a stable frequency in a short time period.

Under such power conservation circumstances for standby modes in radio transceivers, power to the circuits associated with the transmitter is also turned off to conserve battery power. Among such circuits is the transmitter voltage controlled oscillator in the frequency synthesizer. Such oscillators are conventionally locked to a very stable and accurate crystal-controlled oscillator in a feedback loop which compares a fraction of the desired output frequency with a reference frequency provided by the crystal-controlled oscillator, and a difference in the noted frequencies is used to generate a change in the voltage controlling the VCO in order to reduce the difference to zero.

However, a problem is produced under such circumstances since in certain applications it is necessary when switching between receive and transmit modes of operation that the VCO reaches it stable output frequency in the shortest time possible. When the oscillator is allowed to run continuously, it is relatively easy to quickly obtain a stable desired output frequency. The desired result, however, is not easily obtained when the oscillator is not operating continuously, since when power is first applied to the VCO, there is a much greater rate of change of frequency in the first few milliseconds than in later time intervals. Moreover, where this rate of change is greater than the ability of the control voltage to track it, the output frequency will not be stable or quickly settle to the desired frequency.

SUMMARY OF THE INVENTION

I have discovered that the above noted problem can be solved by generating a control voltage applied to a varactor diode coupled to the voltage controlled oscillator circuit in such a manner as to provide compensation of transient frequency drift in the oscillator by varying the frequency in the opposite direction to the natural tendency of the VCO.

Such a control voltage is generated by a circuit including resistors, capacitors and a varactor diode which is powered at the same instant that power is applied to the voltage controlled oscillator. Moreover, the circuit is reset when power is removed. Thus, the rate of change of frequency in the voltage controlled oscillator is reduced to a range where it is capable of tracking the control voltage.

These objects and advantages of my invention will be more completely understood and appreciated by the artisan carefully studying the following description of the presently preferred exemplary embodiments taken in conjunction with the accompanying drawings of which:

DETAILED DESCRIPTION OF THE DRAWINGS

Figure 3:
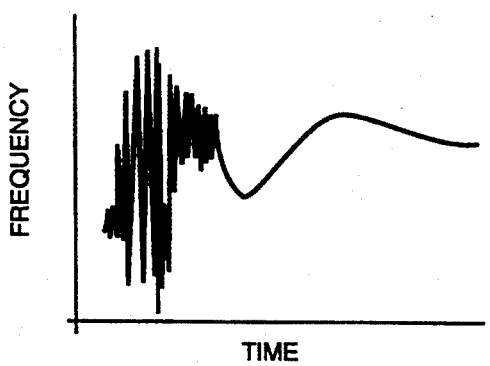
FIG. 3 is an illustration of an oscilloscope display showing the "ringing" in the output frequency of a VCO without the inclusion of my compensation circuit of the nature illustrated in FIG. 1.

As illustrated in FIG. 3, voltage controlled oscillator 10 without compensation in a radio transceiver frequency synthesizer may on power-up exhibit a decreasing transient frequency drift, particularly in the first few milliseconds upon power-up after being turned off in a standby mode of the transceiver. As previously mentioned, when switching between receive and transmit modes in certain applications, it is vital that the VCO reach its stable output frequency in the shortest time possible.

Figure 1:
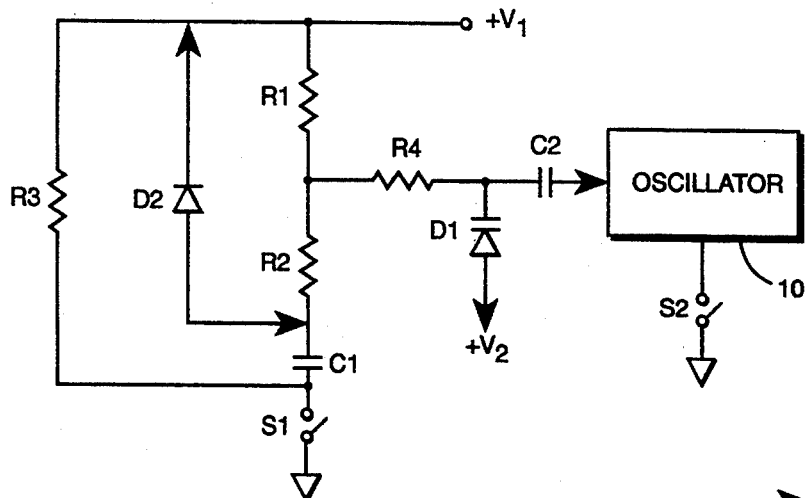
FIG. 1 is an exemplary embodiment of my compensation circuit for oscillators in which the natural tendency of the oscillator transient frequency drift decreases in frequency.

An exemplary embodiment for obtaining such desired results is illustrated in FIG. 1 wherein S1 represents a transistor switch which is turned on simultaneously with the application of power to the VCO 10 by way of closing transistor switch S2. When switch S1 turns on, the voltage across capacitor C1 increases exponentially at a rate determined by the values of the capacitor C1, as well as the values of resistors R1 and R2, which as illustrated are connected to the $+V_1$ power supply line.

A fractional part of the voltage waveform appears at the junction of resistors R1 and R2 which is applied to the cathode of the varactor diode D1 by way of resistor R4. As the voltage applied to the cathode of D1 increases, its capacitance decreases. The resulting decrease in capacitance is coupled to the tank circuit of the VCO by way of coupling capacitor C2.

Thus, as the capacitance of D1 decreases, the oscillator frequency is caused to increase which is in opposition to the naturally decreasing frequency of the oscillator without compensation.

As will be appreciated by the artisan, by a suitable choice of the exponential time constant as well as the degree of coupling to the oscillator tank circuit, the compensation provided by the aforementioned elements acting in combination can be set so that the frequency rate of change during the critical period is reduced to a relatively low value whereby the stable production of the desired output frequency is obtained very quickly in the first few milliseconds. As will be further appreciated by the artisan, resistor R4 reduces the loading of the oscillator tank circuit by the relatively low resistance of R1. Moreover, when switch S1 along with switch S2 are subsequently opened, the capacitor C1 will discharge through resistors R2, R1 and R3, thus rendering the compensation circuit ready for a subsequent cycle of operation. In this regard, the resetting of the circuit when power is removed may be hastened by the inclusion of diode D2 which, as illustrated in FIG. 1, is connected across the resistors R1 and R2, thus forming a bypass circuit.

Figure 4:
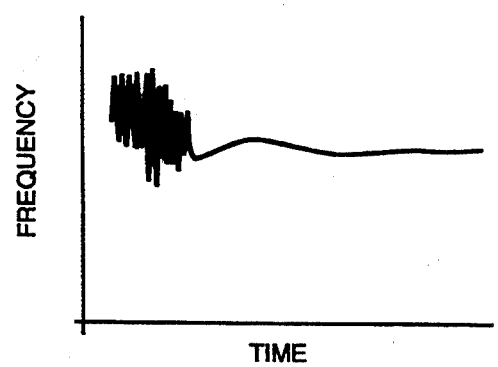
FIG. 4 illustrates an oscilloscope display showing the desired results of a marked reduction in the deviation from the desired frequency with the herein disclosed compensation circuit of FIG. 1 connected to the VCO.

Operating in the manner described permits the transmitter VCO in the frequency synthesizer to quickly obtain the desired output frequency which is stabilized in the shortest time possible whereby substantially immediate tracking by the VCO is obtainable, as illustrated in the oscilloscope display depicted in FIG. 4. That is to say, the compensation circuit of FIG. 1 will generate a control voltage producing the desired results by way of the coupling of the varactor diode to the VCO circuit so as to vary the frequency in a manner opposite to its natural tendency of producing a decreasing frequency. The improved results may be observed by a comparison of the frequency versus time graphs of FIGS. 3 and 4.

Figure 2:
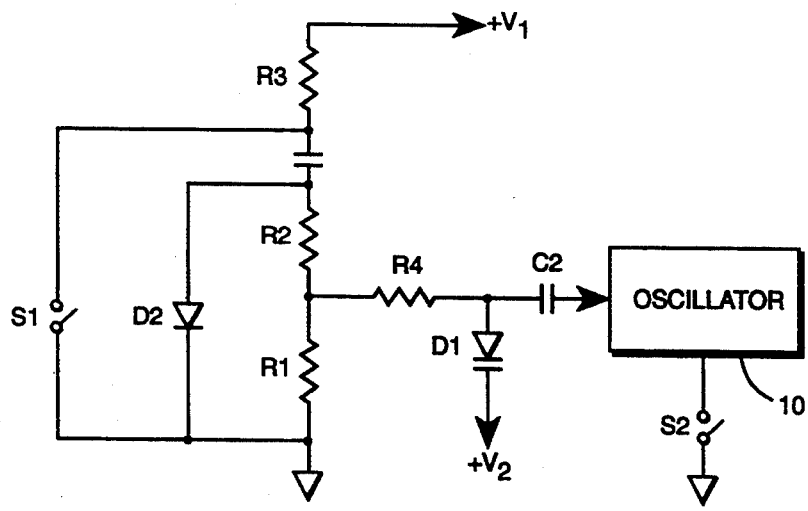
FIG. 2 is an exemplary embodiment of my compensation circuit for those situations in which the frequency of the oscillator may have a natural tendency to increase when power is first applied.

Instances may occur where the frequency of the oscillator 10 may have a natural tendency to increase when power is first applied. FIG. 2 is an illustration of a simple manner in which the varactor diode and other circuit connections may be rearranged so that the voltage on the anode of D1 increases with time to thus provide appropriate compensation when transistor switches S1 and S2 are simultaneously turned on. The compensation obtained will be of the nature graphically illustrated in FIG. 4, for example, but opposite in direction so as to provide appropriate compensation. In this regard, it will be noted that since the same functional components are used the same numerical designations have been used in both figures. However, as aforementioned, the circuit connections are such that simultaneous application of power by the operation of both switch S1 and switch S2 will cause the voltage across the varactor diode D1 to decrease with time to obtain the desired results. As will be appreciated by those skilled in the art, in most applications, circuit component values will be chosen such that the varactor diode D1 is not biased in the forward direction.

Thus, in summary a relatively simple circuit including resistors, capacitors and a varactor diode when simultaneously powered by the same voltage source as that of the oscillator circuit will produce an exponentially varying voltage applied to the varactor resulting in a variation of its capacitance in such a manner as to change the frequency of the oscillator in the opposite direction to its natural tendency on power-up. Thus, a marked reduction in the deviation from the desired output frequency is obtained. Moreover, a suitable choice of component values can be made such that the VCO oscillator frequency is substantially constant over the period of interest.

While the invention has been described in connection with what is presently considered to be the most practical and preferred embodiments, it is to be understood that the invention is not to be limited to the disclosed embodiment but on the contrary is intended to cover various modifications and equivalent arrangements included within the spirit and scope of the appended claims.

What is claimed is:

1. A circuit for use with an oscillator for compensation of the natural transient frequency drift by the oscillator when power is applied thereto, said oscillator having a tank circuit, said circuit comprising:
   a varactor diode coupled to the tank circuit of said oscillator,
   control circuitry for generating and applying a control voltage to said varactor diode for varying the capacitance thereof when power is applied to said control circuitry,
   a switching element for applying power to said control circuitry simultaneously with the application of power to said oscillator,
   wherein the capacitance of the varactor diode is varied by the control circuitry so that deviation from a desired oscillator output frequency is reduced by varying said oscillator output frequency in a direction opposite to said naturally transient frequency drift.

2. A circuit as in claim 1 wherein said control circuitry includes a capacitor connected to a voltage divider and said varactor diode is connected to the voltage divider.

3. A circuit as in claim 2 wherein said varactor diode is connected to said voltage divider by a resistor for reducing the loading on said tank circuit.

4. A circuit as in claim 2 further including a resistor connected across said voltage divider and said capacitor for forming a discharge path when said switching element is operated to remove power from said control circuitry.

5. A circuit as in claim 4 further including a diode connected across said voltage divider for fast discharge of said capacitor when said switching element is operated to remove power from said control circuitry.

6. A circuit as in claim 2 further including a diode connected across said voltage divider for fast discharge of said capacitor when said switching element is operated to remove power from said control circuitry.

7. A circuit as in claim 2 further including a diode connected across said voltage divider for fast charging of said capacitor when said switching element is opened.

8. A circuit as in claim 7 wherein said switching element is connected in parallel with the capacitor and voltage divider.

9. A circuit as in claim 2 wherein said switching element is connected in series with the capacitor and voltage divider.

10. A circuit as in claim 1 further including a capacitor for coupling said varactor diode to said tank circuit.

11. A circuit as in claim 1 wherein said switching element comprises a transistor switch.

12. A circuit as in claim 1 wherein said control circuitry includes a resistor for coupling said control voltage to said varactor diode and said varactor diode is coupled to said tank circuit by a capacitor.

13. A circuit as in claim 1 wherein said oscillator is a voltage controlled oscillator in a frequency synthesizer of a portable radio transceiver.

* * * * *